US012621988B2

(12) United States Patent (10) Patent No.: US 12,621,988 B2
Kim (45) Date of Patent: May 5, 2026

(54) SEMICONDUCTOR DEVICE AND METHOD OF MANUFACTURING THE SEMICONDUCTOR DEVICE

(71) Applicant: SK hynix Inc., Icheon-si (KR)

(72) Inventor: Jae Ho Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 395 days.

(21) Appl. No.: 18/186,679

(22) Filed: Mar. 20, 2023

(65) Prior Publication Data

US 2024/0121951 A1 Apr. 11, 2024

(30) Foreign Application Priority Data

Oct. 7, 2022 (KR) ........................ 10-2022-0128902

(51) Int. Cl.
 *H10B 20/00* (2023.01)
 *H01L 23/528* (2006.01)
(52) U.S. Cl.
 CPC ......... *H10B 20/50* (2023.02); *H01L 23/5283* (2013.01); *H10B 20/40* (2023.02); *H10B 20/65* (2023.02)

(58) Field of Classification Search
 CPC ........ H10B 20/50; H10B 20/40; H10B 20/65; H10B 41/27; H10B 41/35; H10B 41/50; H10B 43/10; H10B 43/27; H10B 43/35; H10B 43/40; H10B 43/50; H01L 23/5283
 See application file for complete search history.

(56) References Cited

U.S. PATENT DOCUMENTS

2019/0081017 A1* 3/2019 Nakajima .............. H10B 43/40
2021/0313343 A1* 10/2021 Jung ...................... H10B 43/35

FOREIGN PATENT DOCUMENTS

KR 1020210121335 A 10/2021
KR 1020210124836 A 10/2021

* cited by examiner

*Primary Examiner* — Allison Bernstein
(74) *Attorney, Agent, or Firm* — WILLIAM PARK & ASSOCIATES LTD.

(57) ABSTRACT

A semiconductor device includes: a source structure comprising a cell area and an edge area; a stack located on the edge area of the source structure; a gate structure located on the cell area of the source structure; a channel structure connected to the cell area of the source structure by extending through the gate structure; and a read-only memory area.

19 Claims, 18 Drawing Sheets

44
SP
43

IL 42B
42A 41D
41C     41
41B
41A

ISO

40

58(OP4)

55B
55A
⋮
55B  ⎫ ST1
55A

53

III

II

SEMICONDUCTOR DEVICE AND METHOD OF MANUFACTURING THE SEMICONDUCTOR DEVICE

CROSS-REFERENCE TO RELATED APPLICATION

This application claims priority under 35 U.S.C. § 119(a) to Korean Patent Application No. 10-2022-0128902 filed on Oct. 7, 2022, in the Korean Intellectual Property Office, which is incorporated herein by reference in its entirety.

BACKGROUND

1. Technical Field

Embodiments of the present disclosure relate to an electronic device and a method of manufacturing the electronic device, and more particularly, to a semiconductor device and a method of manufacturing the semiconductor device.

2. Related Art

The degree of integration of a semiconductor device is mainly determined by an area occupied by a unit memory cell. Recently, as the improvement in the degree of integration of a semiconductor device for forming memory cells in a single layer on a substrate reaches a limit, a three-dimensional semiconductor device for stacking memory cells on a substrate has been proposed. Furthermore, in order to improve the operational reliability of such a semiconductor device, various structures and manufacturing methods have been developed.

SUMMARY

In an embodiment, a semiconductor device may include: a source structure comprising a cell area and an edge area; a stack located on the edge area of the source structure; a gate structure located on the cell area of the source structure; a channel structure connected to the cell area of the source structure by extending through the gate structure; and a read-only memory area comprising a first contact plug located in the edge area of the source structure and a second contact plug connected to the first contact plug by extending through the stack.

In an embodiment, a method of manufacturing a semiconductor device may include: forming a source structure; forming a first contact plug passing through the source structure; forming a first stack on the source structure; forming a first sacrificial layer passing through the first stack and connected to the first contact plug; forming a second stack on the first stack; forming a second sacrificial layer passing through the second stack and connected to the first sacrificial layer; and forming the first contact plug and a second contact plug connected to the first contact plug in a read-only memory area by replacing the first sacrificial layer and the second sacrificial layer with the second contact plug.

DETAILED DESCRIPTION

Various embodiments are directed to a semiconductor device having a stable structure and improved characteristics and a method of manufacturing the same.

In an embodiment of the present technology, it is possible to provide a semiconductor device having a stable structure and improved reliability.

Hereafter, embodiments in accordance with the technical spirit of the present disclosure will be described with reference to the accompanying drawings. It will be understood that when an element or layer etc., is referred to as being "on," "connected to" or "coupled to" another element or layer etc., it can be directly on, connected or coupled to the other element or layer etc., or intervening elements or layers etc., may be present. In contrast, when an element or layer etc., is referred to as being "directly on," "directly connected to" or "directly coupled to" another element or layer etc., there are no intervening elements or layers etc., present. Like numerals refer to like elements throughout.

Figure 1A:
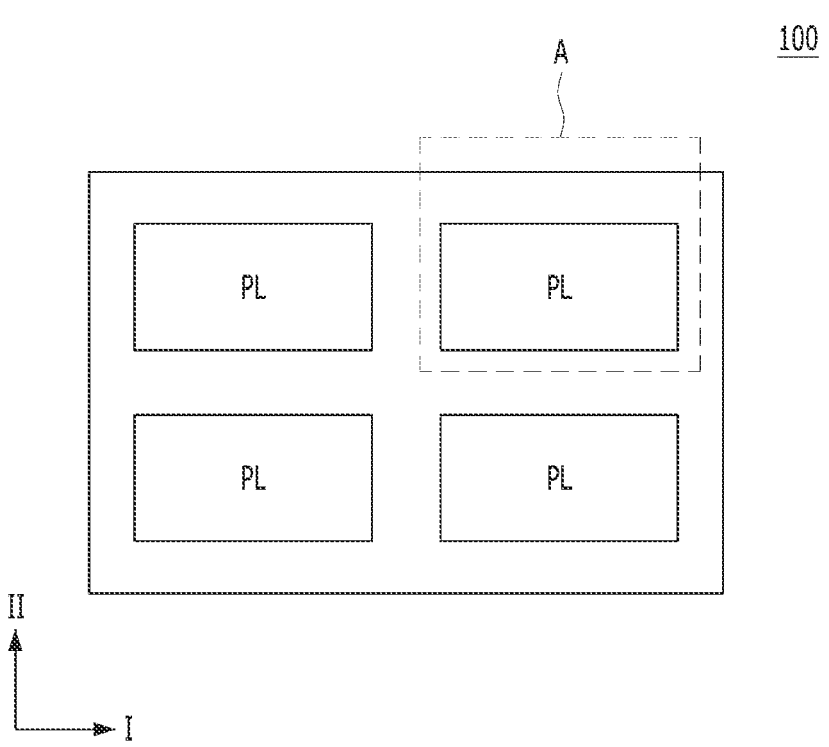
FIG. 1A and FIG. 1B are diagrams illustrating the structure of a semiconductor device in accordance with an embodiment.
Figure 1B:
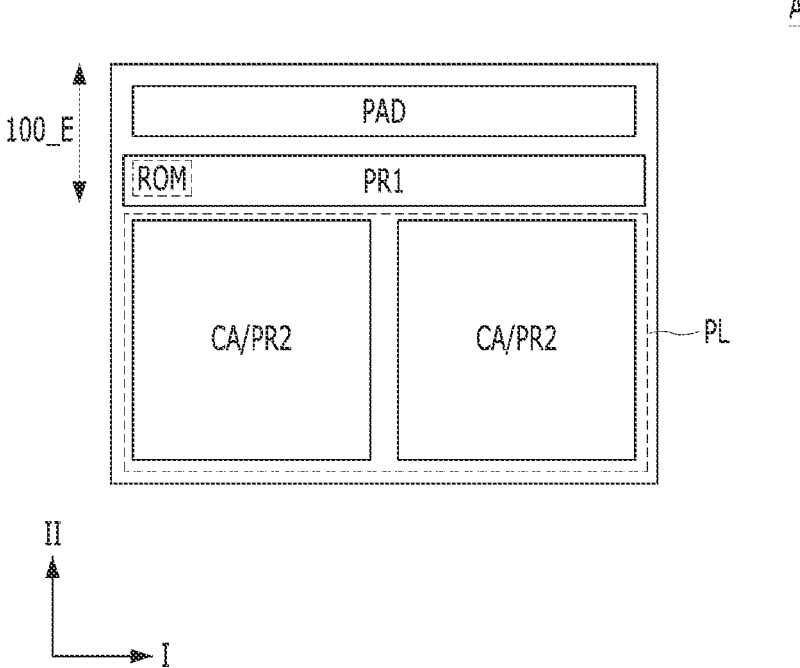

FIG. 1A and FIG. 1B are diagrams illustrating the structure of a semiconductor device in accordance with an embodiment. FIG. 1B illustrates section 'A' of FIG. 1A in accordance with an embodiment.

Referring to FIG. 1A and FIG. 1B, the semiconductor device may include at least one plane PL, a first peripheral circuit PR1, or a pad PAD, or a combination thereof. The semiconductor device may be a semiconductor chip 100.

The planes PL may be arranged in a first direction I, in a second direction II intersecting the first direction I, or in the first direction I and the second direction II. The pad PAD and the first peripheral circuit PR1 may be located around the planes PL. For example, the pad PAD and the first peripheral circuit PR1 may be located in an edge area 100_E of the semiconductor chip 100. The pad PAD may include input/output terminals for receiving a signal from the outside or outputting a signal to the outside. The first peripheral circuit PR1 may include circuits for operating the semiconductor chip 100. The first peripheral circuit PR1 may include a logic circuit, a data path, a read-only memory (ROM), or an analog circuit, or a combination thereof. For example, a read-only memory (ROM) area including the read-only memory (ROM) may be located in the edge area 100_E of the semiconductor chip 100, and the read-only memory (ROM) may be included in the logic circuit.

The plane PL may include a cell array CA or a second peripheral circuit PR2. The cell array CA may include stacked memory cells. For example, the cell array CA may include memory strings. Each of the memory strings may include at least one source select transistor, a plurality of memory cells, and at least one drain select transistor.

The second peripheral circuit PR2 may be located inside the plane PL. The second peripheral circuit PR2 may include a page buffer, a row decoder, or a read-only memory (ROM), or a combination thereof. The second peripheral circuit PR2 may be stacked on or below the cell array CA. Alternatively, the second peripheral circuit PR2 may be distributed around the cell array CA.

Referring to FIG. 1A and FIG. 1B, the first peripheral circuit PR1 or the second peripheral circuit PR2 may include the read-only memory (ROM). The read-only memory (ROM) area including the read-only memory (ROM) may be located in the edge area 100_E of the semiconductor chip 100 or located inside the plane PL. The read-only memory (ROM) is a memory in which data written during a manufacturing process is stored, and may be a memory in which read is only possible and correction or erase of data is not possible. For example, reference data necessary for driving the semiconductor chip 100 may be stored in the read-only memory (ROM). For example, the reference data may include algorithm codes for programming, erasing, and reading the semiconductor chip 100.

According to the structure described above, the read-only memory (ROM) area may be located in the edge area 100_E of the semiconductor chip 100 or located inside the plane PL. Accordingly, in an embodiment, the read-only memory (ROM) may be efficiently disposed in the semiconductor chip 100, and the degree of integration of the semiconductor device may be improved.

Figure 2A:
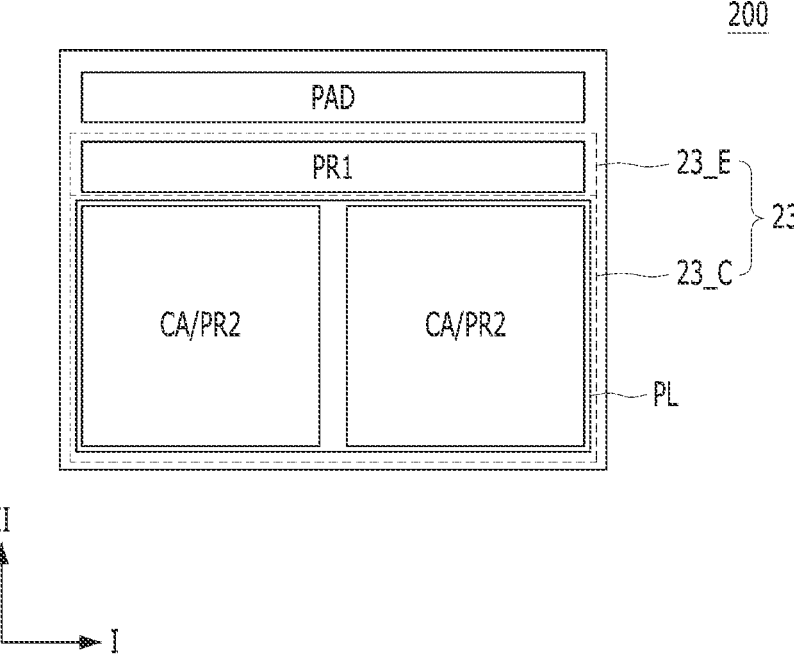
FIG. 2A and FIG. 2B are diagrams illustrating the structure of a semiconductor device in accordance with an embodiment.
Figure 2B:
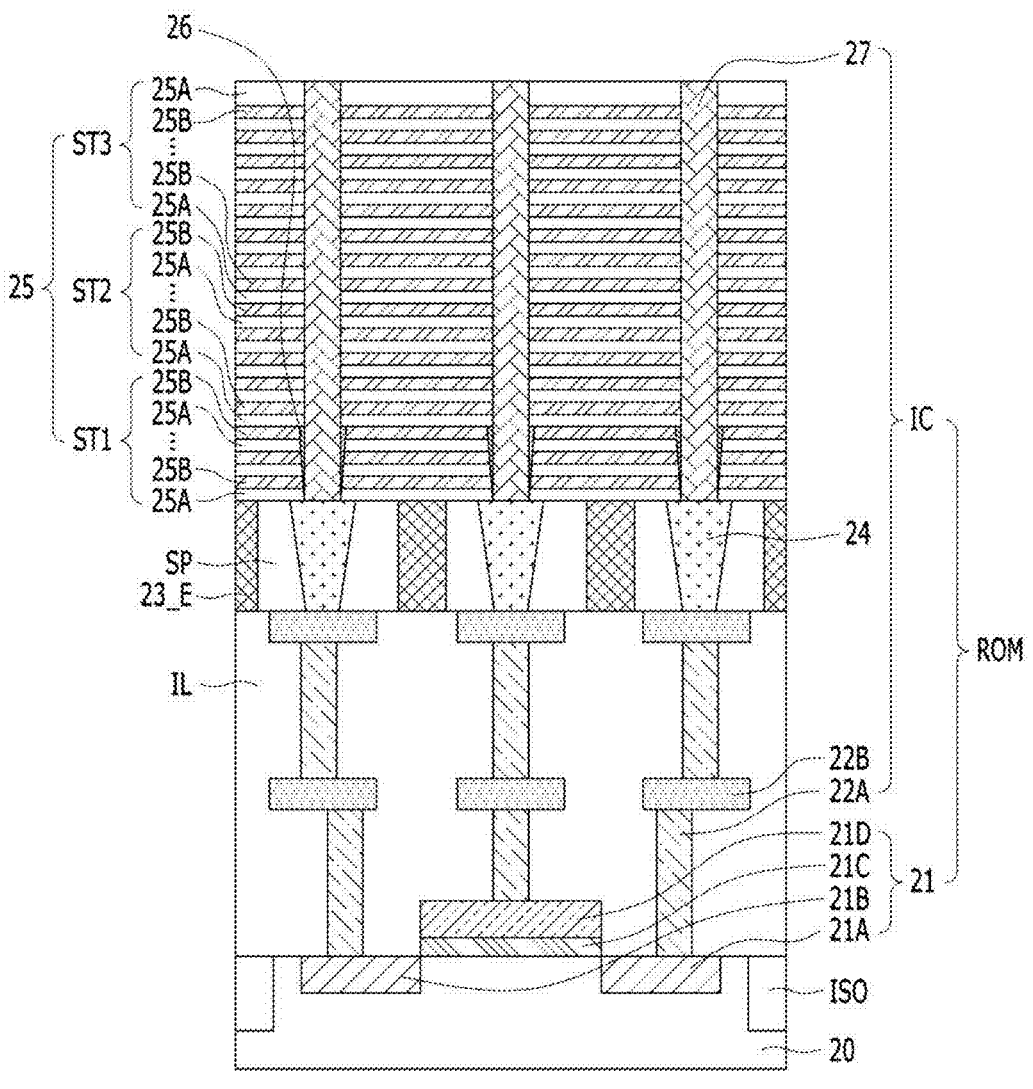

FIG. 2A and FIG. 2B are diagrams for describing the structure of a semiconductor device in accordance with an embodiment. FIG. 2A may be a plan view of the semiconductor device, and FIG. 2B may be a cross-sectional view of an edge area 23_E of a source structure 23. Hereinafter, the content overlapping with the previously described content will be omitted.

Referring to FIG. 2A and FIG. 2B, a semiconductor device 200 may include a substrate 20, the source structure 23, a stack 25, or a read-only memory (ROM), or a combination thereof. The semiconductor device 200 may further include an isolation layer ISO, a spacer SP, an insulating spacer 26, or an interlayer dielectric layer IL, or a combination thereof. The read-only memory (ROM) may be located in a read-only memory (ROM) area, and may include a transistor 21 or an interconnection structure IC, or a combination thereof. In an embodiment, a ROM area might include a first contact plug 24 located in the edge area 23_E of the source structure 23 and a second contact plug 27 connected to the first contact plug 24 by extending through the stack 25. In an embodiment, a ROM area might include a transistor 21 electrically connected to a first contact plug 24. The semiconductor device may be a semiconductor chip 200. In an embodiment, the ROM area is located in an edge area 23_E of a semiconductor chip 200.

The source structure 23 may be located on the substrate 20. The source structure 23 may be located in a cell array CA and may extend up to a position where a first peripheral circuit PR1 is formed. The source structure 23 may include a cell area 23_C and the edge area 23_E. A portion of the source structure 23 located in the cell array CA may be the cell area 23_C, and a portion of the source structure 23 extending to the first peripheral circuit PR1 may be the edge area 23_E. The source structure 23 may include a conductive material such as polysilicon or metal.

The stack 25 may be located on the source structure 23. For example, the stack 25 may be located on the edge area 23_E of the source structure 23. The stack 25 may include a first stack ST1, a second stack ST2, or a third stack ST3, or a combination thereof. The first stack ST1 may be adjacent to the edge area 23_E of the source structure 23, and the second stack ST2 may be spaced apart from the edge area 23_E of the source structure 23. The third stack ST3 may be located on the second stack ST2. The first height H1 of the first stack ST1 may be substantially the same as or different from the second height H2 of the second stack ST2. For example, the first height H1 of the first stack ST1 may be lower than the second height H2 of the second stack ST2.

The stack 25 may include an insulating layer 25A or a sacrificial layer 25B. For example, the stack 25 may include insulating layers 25A and sacrificial layers 25B that are alternately stacked. The sacrificial layers 25B may remain in the process of forming a gate structure of the cell array CA. The insulating layer 25A may include an insulating material such as oxide, and the sacrificial layers 25B may include a sacrificial material such as nitride. For reference, at least a part of the stack 25 may also include a conductive layer instead of the sacrificial layer 25B.

The read-only memory (ROM) is a storage element for storing reference data and may include the transistor 21, a fuse, and the like. For example, the transistor 21 may be located in an active area of the substrate 20. The isolation layer ISO may be located in the substrate 20, and the active area may be defined by the isolation layer ISO. The transistor 21 may include a first junction 21A, a second junction 21B, a gate insulating layer 21C, or a gate electrode 21D. The gate insulating layer 21C may be located between the gate electrode 21D and the substrate 20. The gate insulating layer 21C and the isolation layer ISO may include an insulating material such as oxide or nitride.

The read-only memory (ROM) may include the interconnection structure IC electrically connected to a storage element. For example, data stored in the transistor 21 may be output through the interconnection structure IC. Alternatively, the interconnection structure IC may also be used as a path for writing reference data to the read-only memory (ROM) during the manufacturing process.

The interconnection structure IC may include first contact plugs 24, second contact plugs 27, third contact plugs 22A, or wirings 22B, or a combination thereof.

The first contact plugs 24 may be located in the source structure 23. For example, the first contact plugs 24 may be located in the edge area 23_E of the source structure 23. The first contact plugs 24 may pass through the edge area 23_E of the source structure 23. Each of the first contact plugs 24 may be connected to the wiring 22B by extending through the source structure 23. The spacer SP may be located on a sidewall of the first contact plug 24, and the first contact plugs 24 and the source structure 23 may be insulated from each other by the spacer SP.

The second contact plugs 27 may be located on the edge area 23_E of the source structure 23. The second contact plugs 27 may pass through the stack 25. The second contact plugs 27 may extend through the stack 25 in the stacking direction of the insulating layers 25A. For example, the second contact plugs 27 may be respectively connected to the first contact plugs 24 by extending through the stack 25. The second contact plugs 27 may be respectively connected to the first contact plugs 24 by passing through the stack 25.

The insulating spacer 26 may be located in the stack 25. The insulating spacer 26 may pass through a part of the stack 25. For example, the insulating spacer 26 may pass through the first stack ST1. The insulating spacer 26 may surround a sidewall of the second contact plug 27.

For reference, the film configuration and shape of the insulating spacer 26 may be changed. The insulating spacer 26 may be a single layer or a multilayer layer. The insulating spacer 26 may extend into the second stack ST2 or into the third stack ST3 while surrounding the sidewall of the contact plug 27. Alternatively, the semiconductor device 200 might not include the insulating spacer 26.

The third contact plugs 22A or the wirings 22B may be located below the source structure 23. For example, the third contact plugs 22A or the wirings 22B may be located below the edge area 23_E of the source structure 23. The interlayer dielectric layer IL may be located between the substrate 20 and the source structure 23, and the third contact plugs 22A or the wirings 22B may be located in the interlayer dielectric layer IL. Each of the third contact plugs 22A may connect the junctions 21A and 21B of the transistor 21 to the wiring 22B or may connect the wirings 22B. The wirings 22B may connect the third contact plugs 22A, or may connect the first contact plug 24 and the third contact plug 22A.

The first contact plugs 24, the second contact plugs 27, the third contact plugs 22A or the wirings 22B may each include a conductive material such as aluminum, copper, or tungsten. The spacer SP or the insulating spacer 26 may include an insulating material such as oxide, nitride, or air gap.

According to the structure described above, the read-only memory (ROM) may include the transistor 21 for storing data, and the interconnection structure IC for providing a path for inputting and outputting signals to and from the transistor 21. The read-only memory (ROM) area may be located in the edge area 23_E of the source structure 23, and the read-only memory (ROM) may have a three-dimensional structure similar to that of the cell array CA.

Figure 3A:
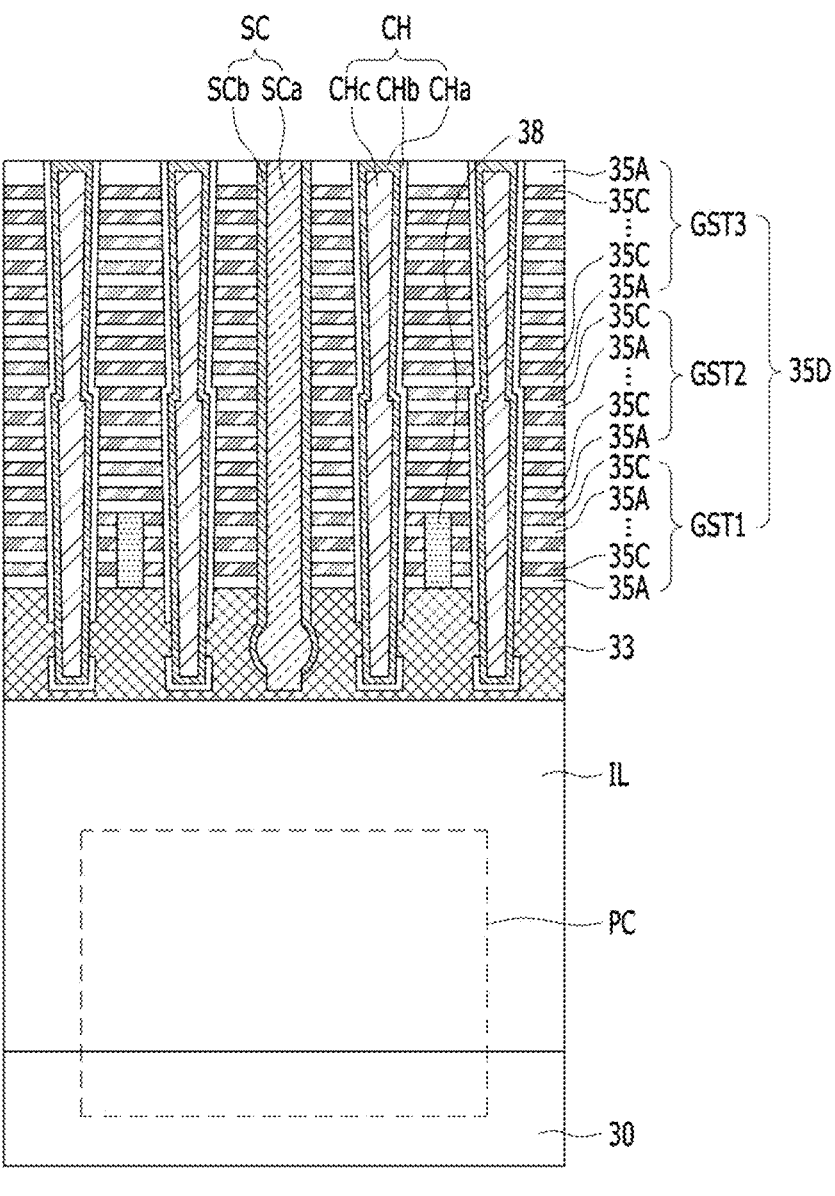
FIG. 3A, 3B, and FIG. 3C are diagrams for describing a semiconductor device in accordance with an embodiment.
Figure 3B:
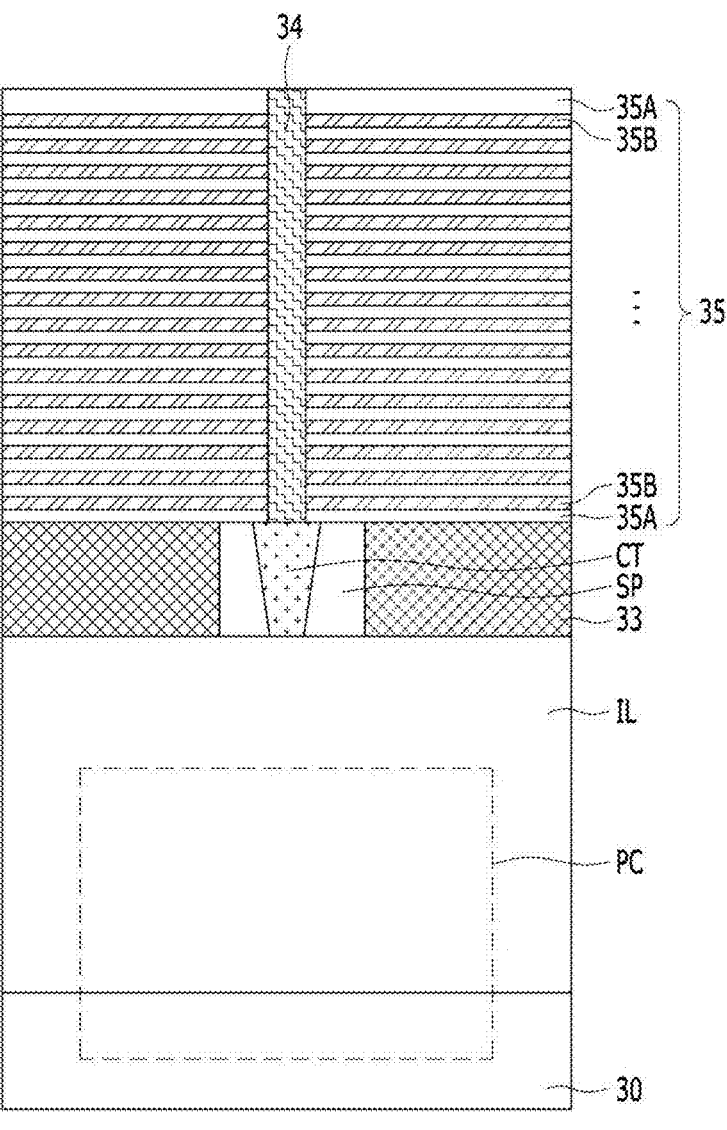
Figure 3C:
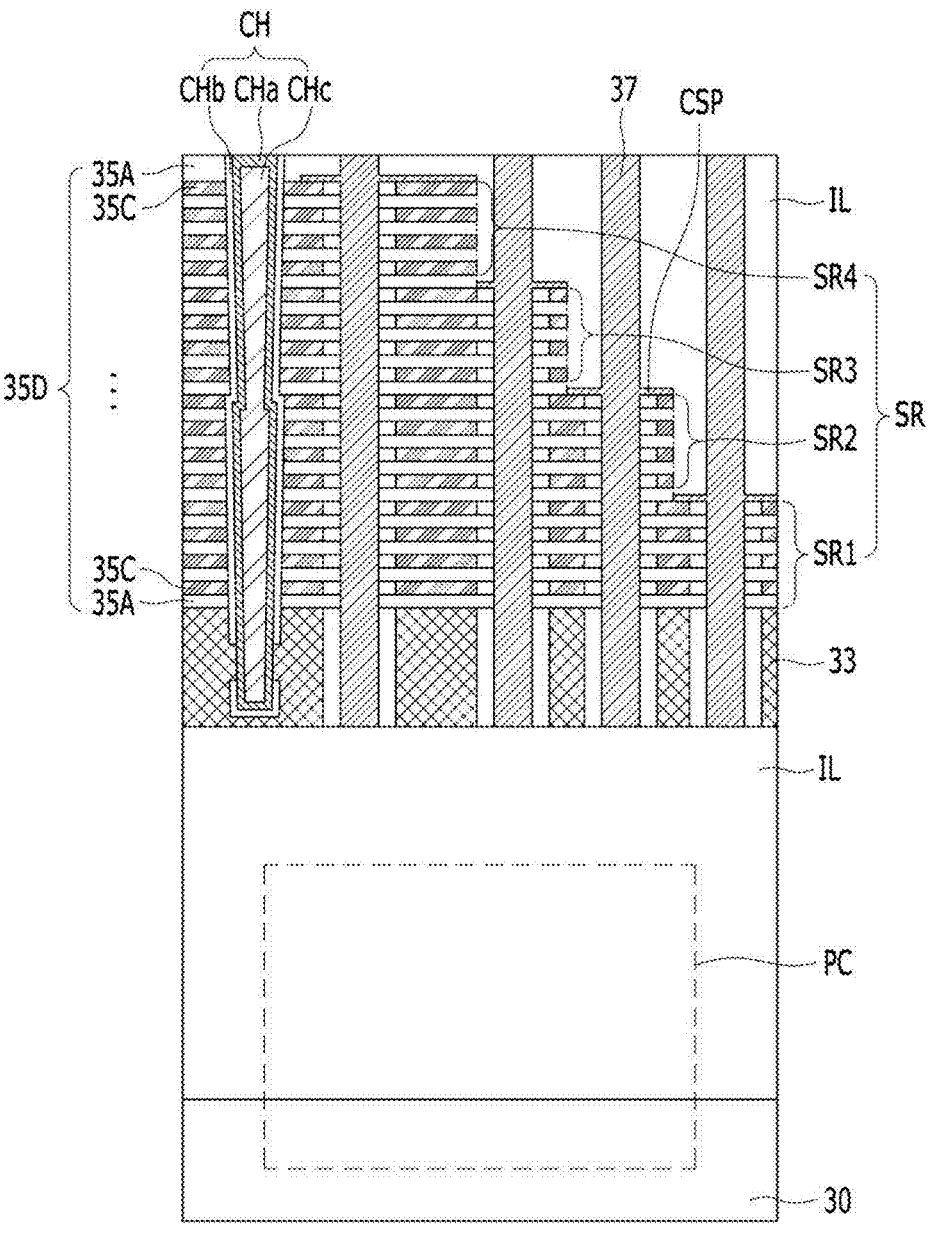

FIG. 3A to FIG. 3C are diagrams for describing a semiconductor device in accordance with an embodiment. Hereinafter, the content overlapping with the previously described content will be omitted.

Referring to FIG. 3A, the semiconductor device may include a substrate 30, a source structure 33, a gate structure 35D, a channel structure CH, or a source contact structure SC, or a combination thereof. The semiconductor device may further include a peripheral circuit PC, an interlayer dielectric layer IL, or an isolation insulating layer 38, or a combination thereof.

The source structure 33 may be located on the substrate 30. The source structure 33 may include a cell area and an edge area. FIG. 3A may be a cross-sectional view of the cell array CA described with reference to FIG. 2A, and may illustrate the cell area of the source structure 33. For example, the cell area of the source structure 33 may be the cell area 23_C of the source structure 23 in FIG. 2A. The source structure 33 illustrated in FIG. 3A and the source structure 23 in FIG. 2B may be interconnected.

The peripheral circuit PC may be located below the source structure 33. The peripheral circuit PC may be the second peripheral circuit PR2 in FIG. 2A, and may include a page buffer or a row decoder. The peripheral circuit PC may include a transistor having a structure similar to that of the transistor 21 in FIG. 2B. A peripheral circuit interconnection connected to the peripheral circuit PC may be included in the interlayer dielectric layer IL. The peripheral circuit interconnection may correspond to the third contact plugs 22A or the wirings 22B in FIG. 2B.

The gate structure 35D may be located on the source structure 33. For example, the gate structure 35D may be located on the cell area of the source structure 33. The gate structure 35D may have a structure similar to that of the stack 25 in FIG. 2B. The gate structure 35D may include insulating layers 35A and conductive layers 35C that are alternately stacked. The gate structure 35D may be connected to the stack 25 in FIG. 2B. For example, the insulating layers 25A of the stack 25 in FIG. 2B and the insulating layers 35A of the gate structure 35D may be an interconnected single layer. The sacrificial layers 25B of the stack 25 in FIG. 2B may remain without being replaced with the conductive layers 35C during a manufacturing process.

The gate structure 35D may include a first gate structure GST1, a second gate structure GST2, or a third gate structure GST3, or a combination thereof. The first gate structure GST1 may be adjacent to the cell area of the source structure 33, and the second gate structure GST2 may be spaced apart from the cell area of the source structure 33. The third gate structure GST3 may be located on the second gate structure GST2. The conductive layers 35C of the first gate structure GST1 may be source select lines, and the conductive layers 35C of the second gate structure GST2 may be word lines. At least one uppermost conductive layer 35C of the third gate structure GST3 may be a drain select line, and the remaining conductive layers 35C may be word lines.

The first gate structure GST1 may correspond to the first stack ST1 in FIG. 2B, the second gate structure GST2 may correspond to the second stack ST2 in FIG. 2B, and the third gate structure GST3 may correspond to the third stack ST3. The first height H1 of the first gate structure GST1 may be substantially the same as or different from the second height H2 of the second gate structure GST2. For example, the first height H1 of the first gate structure GST1 may be lower than the second height H2 of the second gate structure GST2. The insulating layer 35A may include an insulating material such as oxide, and the conductive layers 35C may include a conductive material such as polysilicon, tungsten, or molybdenum.

The isolation insulating layer 38 may be located in the gate structure 35D. The isolation insulating layer 38 may pass through a part of the gate structure 35D. For example, the isolation insulating layer 38 may pass through the first gate structure GST1. The isolation insulating layer 38 may be connected to the cell area of the source structure 33 by passing through the first gate structure GST1. The isolation insulating layer 38 may correspond to the insulating spacer 26 in FIG. 2B. For example, the isolation insulating layer 38 may be located at substantially the same level as the insulating spacer 26 in FIG. 2B or may include substantially the same material as the insulating spacer 26 in FIG. 2B. The isolation insulating layer 38 may electrically isolate source select lines located at substantially the same level. Consequently, the source select lines may be individually driven. The isolation insulating layer 38 may include an insulating material such as oxide or nitride.

The channel structures CH may be located on the source structure 33. For example, the channel structures CH may be located on the cell area of the source structure 33. Each of the channel structures CH may pass through the gate structure 35D. Each of the channel structures CH may extend in a direction, in which the insulating layers 35A are stacked, through the gate structure 35D and may be connected to the cell area of the source structure 33. For example, a channel layer CHa may be directly connected to the source structure 33, or may be connected to the cell area of the source structure 33 through an epitaxially grown semiconductor pattern.

Each of the channel structures CH may further include at least one of a memory layer CHb surrounding a sidewall of the channel layer CHa and an insulating core CHc in the channel layer CHa. The channel layer CHa may include a semiconductor material such as silicon or germanium. The memory layer CHb may include a blocking layer, a data storage layer, or a tunneling layer, or a combination thereof. The insulating core CHc may include an insulating material such as oxide, nitride, or an air gap.

The source contact structure SC may be located on the source structure 33. For example, the source contact structure SC may be located on the cell area of the source structure 33. The source contact structure SC may pass through the gate structure 35D. The source contact structure SC may extend in a direction, in which the insulating layers 35A are stacked, through the gate structure 35D and may be connected to the cell area of the source structure 33.

The source contact structure SC may include a source contact plug SCa or a source contact spacer SCb. The source contact plug SCa may extend in the stacking direction of the insulating layers 35A through the gate structure 35D and may be connected to the cell area of the source structure 33. The source contact spacer SCb may surround a sidewall of the source contact plug SCa. The source contact plug SCa may include polysilicon, metal, or the like. The source contact spacer SCb may include an insulating material such as oxide, nitride, or an air gap.

Referring to FIG. 3B, the semiconductor device may further include a contact structure CT, a spacer SP, a dummy stack 35, or a first cell contact plug 34, or a combination thereof.

The contact structure CT may be located in the source structure 33. For example, the contact structure CT may be located in the cell area of the source structure 33. The contact structure CT may pass through the source structure 33. For example, the contact structure CT may pass through the cell area of the source structure 33. The spacer SP may surround a sidewall of the contact structure CT. The contact structure CT may have a structure similar to that of the first contact plugs 24 in FIG. 2B. For example, the contact structure CT may be located at substantially the same level as the first contact plugs 24 in FIG. 2B or may include substantially the same material as the first contact plugs 24 in FIG. 2B. The contact structure CT may include a conductive material such as tungsten, and the spacer SP may include an insulating material such as oxide.

The dummy stack 35 may be located on the source structure 33. For example, the dummy stack 35 may be located on the cell area of the source structure 33. The dummy stack 35 may have a structure similar to that of the stack 25 in FIG. 2B. The dummy stack 35 may include insulating layers 35A and sacrificial layers 35B that are alternately stacked. The dummy stack 35 may be connected to the stack 25 in FIG. 2B or the gate structure 35D in FIG. 3A. For example, the insulating layers 25A of the stack 25 in FIG. 2B, and the insulating layers 35A of the gate structure 35D may be an interconnected single layer. The insulating layer 35A may include an insulating material such as oxide, and the sacrificial layer 35B may include a sacrificial material such as nitride.

The first cell contact plug 34 may be located on the contact structure CT. The first cell contact plug 34 may pass through the dummy stack 35. The first cell contact plug 34 may extend in the stacking direction of the insulating layers 35A through the dummy stack 35. The first cell contact plug 34 may be connected to the contact structure CT by passing through the dummy stack 35. The first cell contact plug 34 may have a structure similar to that of the second contact plug 27 in FIG. 2B. For example, the first cell contact plug 34 may be located at substantially the same level as the second contact plug 27 in FIG. 2B. The first cell contact plug 34 may be a part of an interconnection structure electrically connected to the peripheral circuit PC together with the contact structure CT or may be a support used in a manufacturing process. The first cell contact plug 34 may include a conductive material such as tungsten or an insulating material such as oxide.

Referring to FIG. 3C, the semiconductor device may further include second cell contact plugs 37.

The gate structure 35D may have a stepped structure SR. The stepped structure SR may include insulating layers 35A and conductive layers 35C that are alternately stacked. The gate structure 35D may include at least one stepped structure SR so that the conductive layers 35C are exposed. For example, the stepped structure SR may include a first stepped structure SR1, a second stepped structure SR2, a third stepped structure SR3, and a fourth stepped structure SR4.

The second cell contact plugs 37 may pass through the interlayer dielectric layer IL, the gate structure 35D, and the source structure 33. Each of the second cell contact plugs 37 may be electrically connected to the conductive layer 35C exposed on the top of each of the stepped structures SR1 to SR4. For example, each of the second cell contact plugs 37 may include a protrusion on a sidewall thereof, and may be electrically connected to the conductive layer 35C, which is exposed on the top of each of the stepped structures SR1 to SR4, by the protrusion. A cell spacer CSP may be located on a part of the sidewall of each of the second cell contact plugs 37. The cell spacer CSP may be located between the second cell contact plugs 37 and the conductive layers 35C. The cell spacer CSP may insulate the second cell contact plug 37 from the remaining conductive layers 35C except for the uppermost conductive layer 35C of each of the stepped structures SR1 to SR4.

The second cell contact plug 37 may have a structure similar to that of the second contact plug 27 in FIG. 2B. For example, the second cell contact plug 37 may be located at substantially the same level as the second contact plug 27 in FIG. 2B or may include substantially the same material as the second contact plug 27 in FIG. 2B. The second cell contact plugs 37 may each include a conductive material such as tungsten. The cell spacer CSP may include an insulating material such as oxide, nitride, or an air gap.

For reference, although not illustrated in the drawing, the second cell contact plugs 37 may be connected to the peripheral circuit PC located below the source structure 33 by passing through the source structure 33. FIG. 3C illustrates that the second cell contact plugs 37 pass through the interlayer dielectric layer IL, the gate structure 35D, and the source structure 33; however, the present disclosure is not limited thereto. For example, each of the second cell contact plugs 37 may be connected to the conductive layer 35C exposed on the top of each of the stepped structures SR1 to SR4 by passing through the interlayer dielectric layer IL. In this case, the second cell contact plugs 37 may each include no protrusion.

According to the structure described above, structures constituting a cell array may correspond to structures constituting a read-only memory (ROM). Accordingly, the read-only memory (ROM) having a three-dimensional structure similar to that of the cell array may be implemented.

FIG. 4A to FIG. 4F are diagrams for describing a method of manufacturing a semiconductor device in accordance with an embodiment. Hereinafter, the content overlapping with the previously described content will be omitted.

Figure 4A:
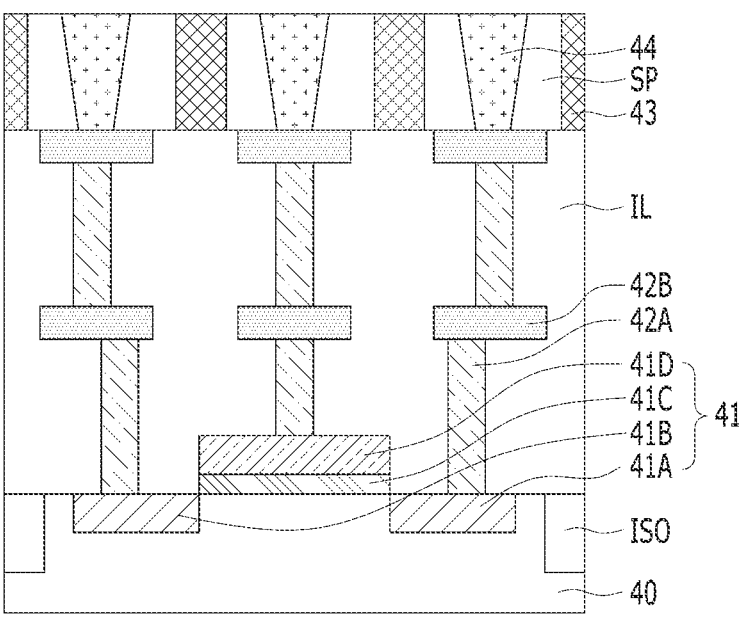
FIG. 4A, 4B, 4C, 4D, 4E, and FIG. 4F are diagrams for describing a method of manufacturing a semiconductor device in accordance with an embodiment.
Figure 4A:
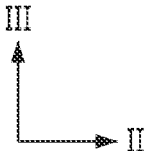

Referring to FIG. 4A, a storage element of a read-only memory (ROM) may be formed on a substrate 40. For example, a transistor 41, which is the storage element of the read-only memory (ROM), may be formed in a read-only memory (ROM) area. An isolation layer ISO may be formed in the substrate 40, and a gate insulating layer 41C, a gate electrode 41D, and junctions 41A and 41B may be formed. For reference, a storage element such as a fuse may also be formed instead of the transistor 41.

Subsequently, third contact plugs 42A and wirings 42B connected to the transistor 41 may be formed. The third contact plugs 42A and the wirings 42B may be formed in the interlayer dielectric layer IL.

Subsequently, a source structure 43 may be formed. The source structure 43 may include a cell area and an edge area. For example, the edge area of the source structure 43 may be the edge area 23_E of the source structure 23 in FIG. 2A, and may correspond to the edge area of the semiconductor chip 200.

Subsequently, first contact plugs 44 passing through the source structure 43 may be formed. First, openings, which expose the third contact plugs 42A or the wirings 42B by passing through the edge area of the source structure 43, may be formed, and insulating layers may be formed in the openings, respectively. Subsequently, the first contact plugs 44 may be formed in the insulating layers, respectively. In this case, insulating layers remaining while forming the first contact plugs 44 may be defined as spacers SP. The first contact plugs 44 may be used as a path for outputting data stored in the transistor 41 or writing data.

Figure 4B:
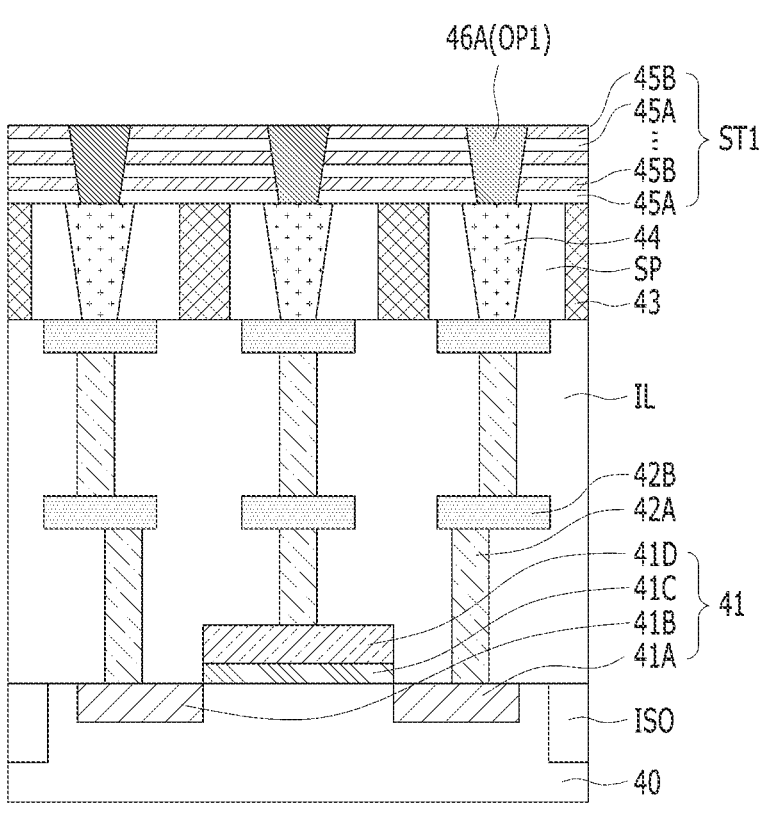
Figure 4B:
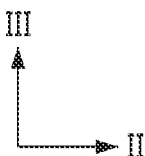

Referring to FIG. 4B, a first stack ST1 may be formed on the source structure 43. For example, the first stack ST1 may be formed on the edge area of the source structure 43. For reference, the first stack ST1 may extend up to the cell area of the source structure 43. The first stack ST1 may be formed by alternately stacking first material layers 45A and second material layers 45B. For example, the first material layers 45A may each include an insulating material such as oxide, and the second material layers 45B may each include a sacrificial material such as nitride or a conductive material such as polysilicon, tungsten, and molybdenum.

Subsequently, first sacrificial layers 46A may be formed. First, a first opening OP1, which exposes each of the first contact plugs 44, may be formed by passing through the first stack ST1. Subsequently, the first sacrificial layer 46A may be formed in the first opening OP1. Each of the first sacrificial layers 46A may be connected to the first contact plug 44 by passing through the first stack ST1. When the first sacrificial layer 46A is formed, an isolation insulating layer of a cell array may be formed together. This will be described below with reference to FIG. 5A to FIG. 5C.

Figure 4C:
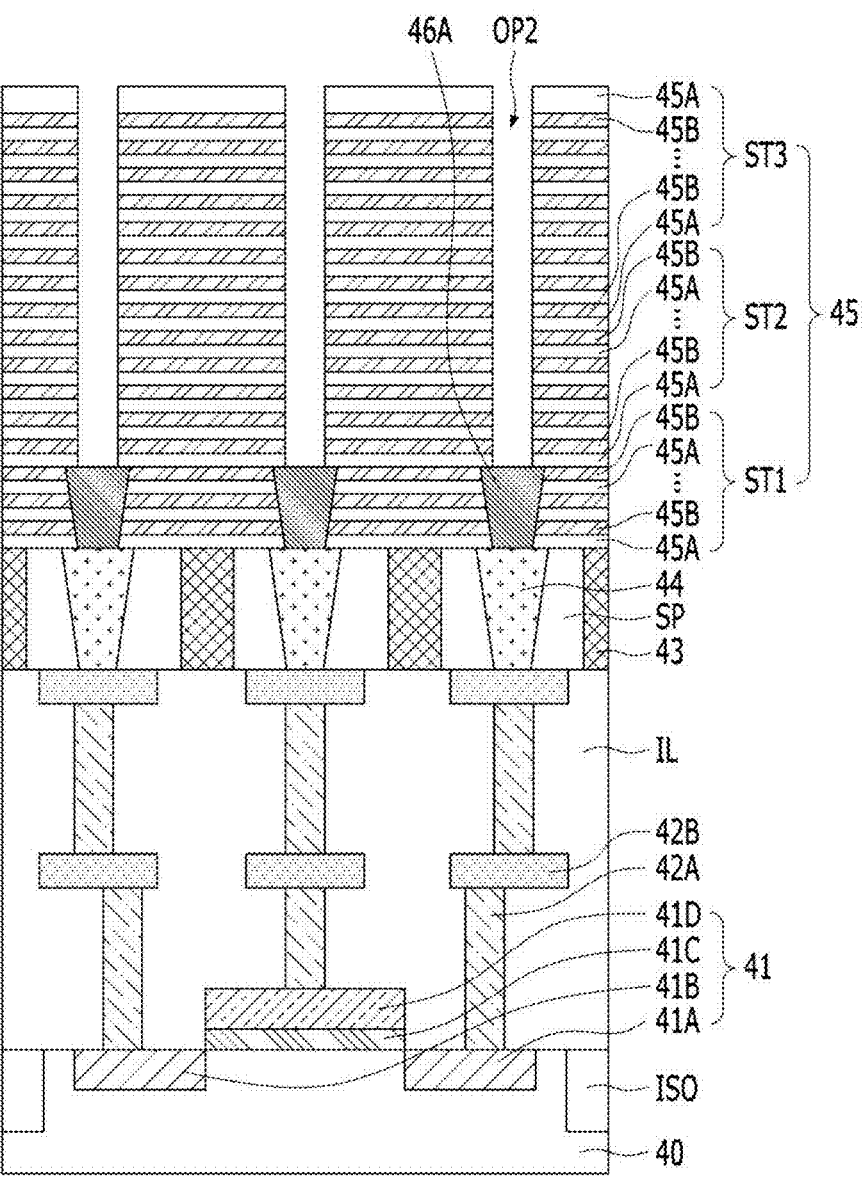

Referring to FIG. 4C, a second stack ST2 may be formed on the first stack ST1. Subsequently, a third stack ST3 may be formed on the second stack ST2. Accordingly, a stack 45 including the first stack ST1, the second stack ST2, and the third stack ST3 may be formed. The second stack ST2 and the third stack ST3 may each be formed by alternately stacking the first material layers 45A and the second material layers 45B. The first height H1 of the first stack ST1 may be substantially the same as or different from the second height H2 of the second stack ST2. For example, the first height H1 of the first stack ST1 may be formed to be lower than the second height H2 of the second stack ST2.

Subsequently, a second opening OP2 may be formed to expose each of the first sacrificial layers 46A by passing through the second stack ST2 and the third stack ST3. In this case, a part of an upper surface of each of the first sacrificial layers 46A may be etched. When the second opening OP2 is formed, a fifth opening OP5 of the cell array may be formed together. This will be described below with reference to FIG. 6.

Figure 4D:
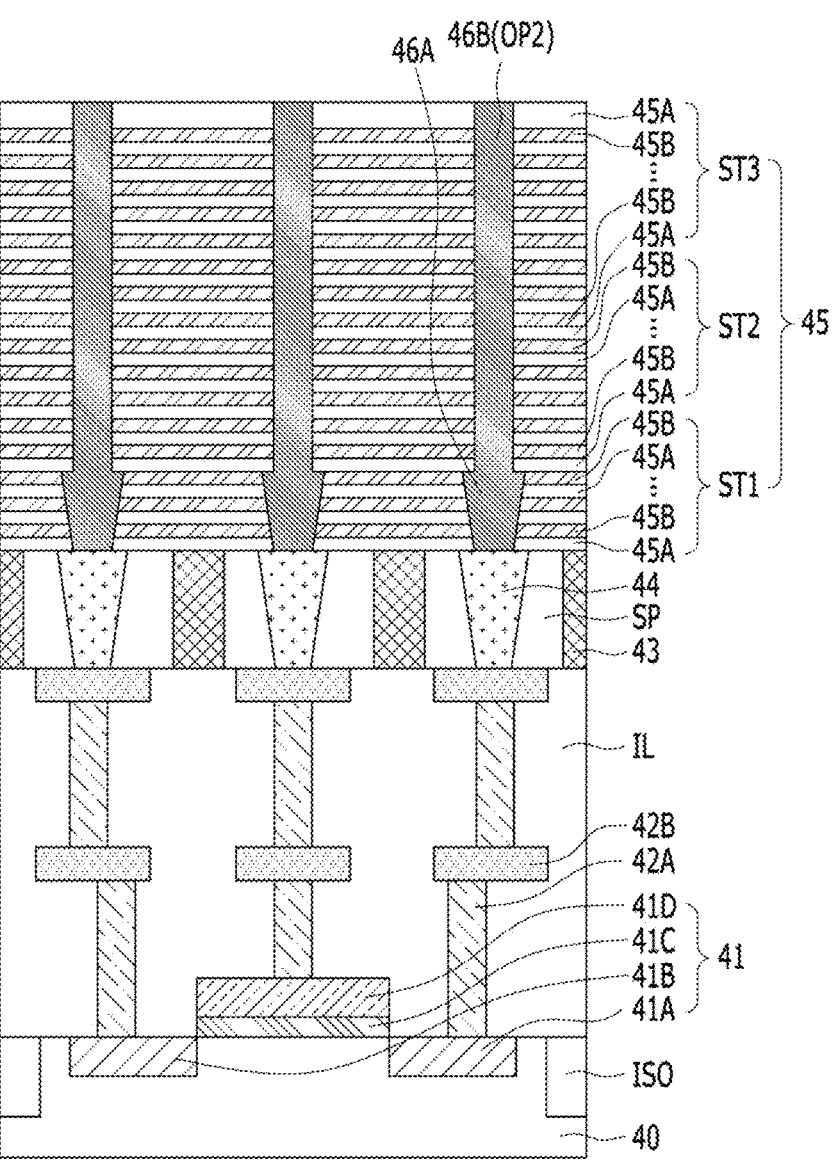

Referring to FIG. 4D, second sacrificial layers 46B may be formed. Each of the second sacrificial layers 46B may be formed in the second opening OP2. Each of the second sacrificial layers 46B may be connected to the first sacrificial layers 46A by passing through the third stack ST3 and the second stack ST2. The second sacrificial layers 46B may each include substantially the same material as the first sacrificial layers 46A. The second sacrificial layers 46B may each include an insulating material such as oxide or nitride.

For reference, in the present embodiment, a case in which the second opening OP2 passing through the second stack ST2 and the third stack ST3 is formed at once has been described; however, the second opening OP2 passing through the second stack ST2 and a third opening passing through the third stack ST3 may be formed. For example, a second opening, which exposes the first sacrificial layers 46A, may be formed by passing through the second stack ST2, and a second sacrificial layer may be formed in the second opening. Subsequently, a third opening passing through the third stack ST3 may be formed, and third sacrificial layers may be formed in the third opening.

Figure 4E:
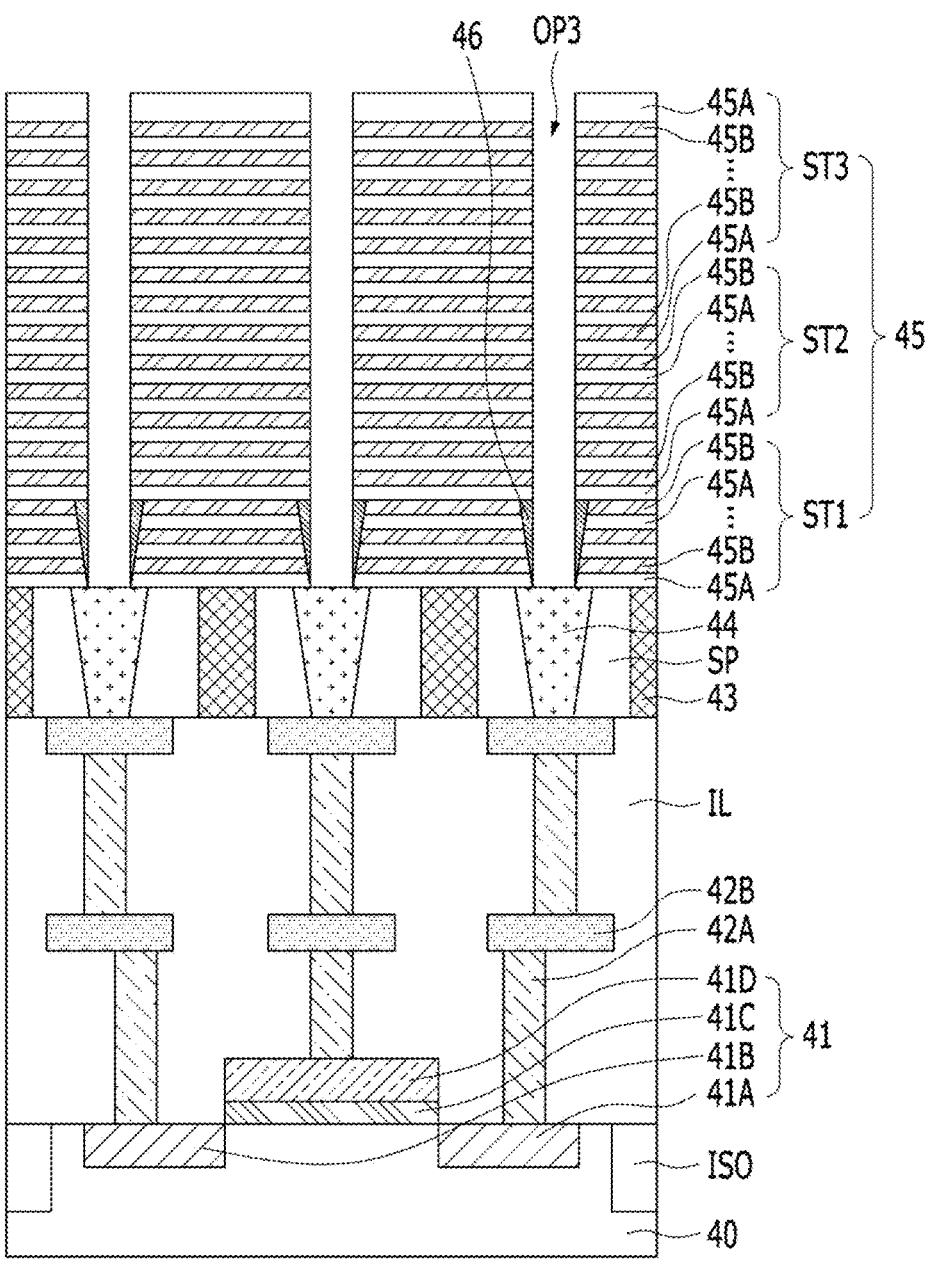

Referring to FIG. 4E, third openings OP3 passing through the stack 45 may be formed. The first opening OP1 and the second opening OP2 may be re-opened by etching the second sacrificial layer 46B and the first sacrificial layer 46A. For example, the second opening OP2 and the first opening OP1 may be formed by etching the second sacrificial layer 46B and the first sacrificial layer 46A by using a mask pattern as an etch barrier. Alternatively, the second sacrificial layer 46B and the first sacrificial layer 46A may be selectively etched under conditions having an etch selectivity with respect to the first material layers 45A and the second material layers 45B. In this case, the first opening OP1 and the second opening OP2 connected to each other may be defined as the third opening OP3. Each of the third openings OP3 may pass through the third stack ST3, the second stack ST2, and the first stack ST1. Each of the third openings OP3 may expose the first contact plug 44. When the third opening OP3 is formed, a sixth opening OP6 of the cell array may be formed together. This will be described below with reference to FIG. 7.

When the third openings OP3 are formed, a part of the second sacrificial layer 46B or the first sacrificial layer 46A may remain without being etched. For example, in the process of etching the first sacrificial layer 46A, a part of the first sacrificial layer 46A may remain in the first opening OP1, and the remaining portion may be used as an insulating spacer 46. For reference, a part of the second sacrificial layer 46B may remain, or both the second sacrificial layer 46B and the first sacrificial layer 46A may be removed.

Figure 4F:
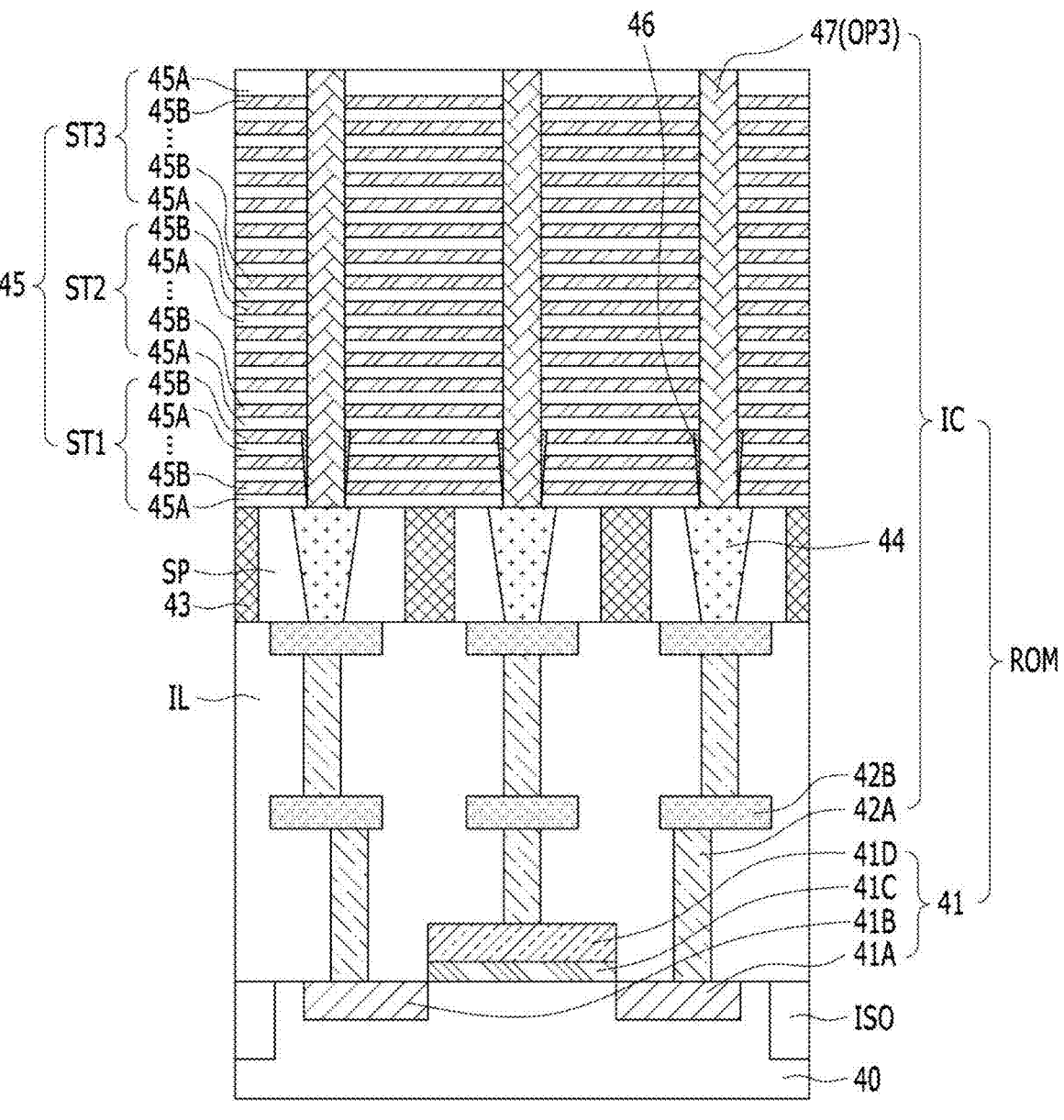

Referring to FIG. 4F, second contact plugs 47 may be formed. The second contact plug 47 may be formed in the third openings OP3, respectively. The second contact plugs 47 may be formed to be respectively connected to the first contact plugs 44. The second contact plugs 47 may be used as a path for outputting data stored in the transistor 41 or writing data. When the second contact plugs 47 are formed, second cell contact plugs 77 of the cell array may be formed together. This will be described below with reference to FIG. 7.

For reference, an insulating spacer may be additionally formed in the third opening OP3 before the second contact plugs 47 are formed. For example, after the insulating spacer is formed on sidewalls of the first stack ST1, the second stack ST2, and the third stack ST3 exposed through the third openings OP3, the second contact plugs 47 may also be formed.

Furthermore, when the second material layers 44B are sacrificial layers, the second material layers 44B may be substantially maintained as they are or replaced with third material layers each including a conductive layer during the manufacturing process. When the second material layers 44B are replaced with the conductive layers, an insulating spacer may be additionally formed before the second contact plugs 47 are formed, so that the second contact plug 47 and the third material layers may be electrically separated from each other.

Accordingly, an interconnection structure IC including the first contact plugs 44, the second contact plugs 47, the third contact plugs 42A or the wirings 42B, or a combination thereof may be formed. Furthermore, a read-only memory (ROM) including the interconnection structure (IC) and the transistor 41 may be formed in the read-only memory (ROM) area.

Subsequently, reference data may be written to the read-only memory (ROM). For example, reference data may be written by applying a bias to the transistor 41 through the interconnection structure IC. For reference, in the present embodiment, a case in which data is written to the read-only memory (ROM) after both the storage element and the interconnection structure are formed has been described; however, the source structure, the interconnection structure, and the like may be formed after data is written to a fuse and the like.

According to the manufacturing method described above, in forming the second contact plug 47 having a large aspect ratio, the third opening OP3 may be formed through a plurality of processes. After the first opening OP1 passing through the first stack ST1 is formed first, the second opening OP2 passing through the second stack ST2 and the third stack ST3 may be formed.

When the third opening OP3 having a large aspect ratio is etched in a one-time etching process, the third opening OP3 may be formed to have a non-uniform depth or a not-open phenomenon may occur in which the third opening OP3 is not etched to a desired depth. In the case of the edge area of the source structure 43, this phenomenon may occur more frequently due to limitations in the etching process. Therefore, this phenomenon may be minimized or substantially prevented by forming the third opening OP3 located in the edge area of the source structure 43 through a plurality of processes. Furthermore, a read-only memory (ROM) having a three-dimensional structure may be formed in the read-only memory (ROM) area by using a cell array process.

Figure 5A:
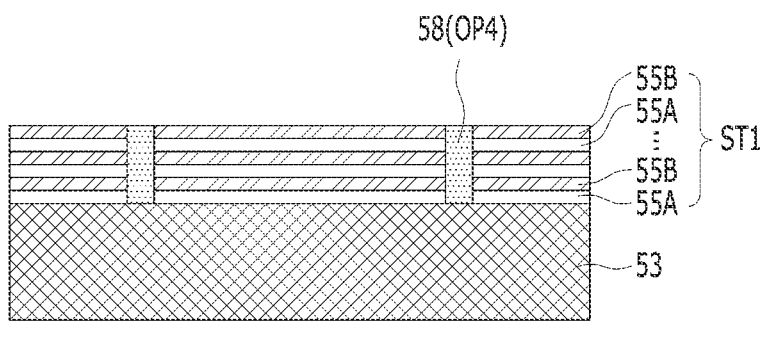
FIG. 5A, 5B, and FIG. 5C are diagrams for describing a method of manufacturing a semiconductor device in accordance with an embodiment.
Figure 5A:
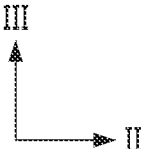
Figure 5B:
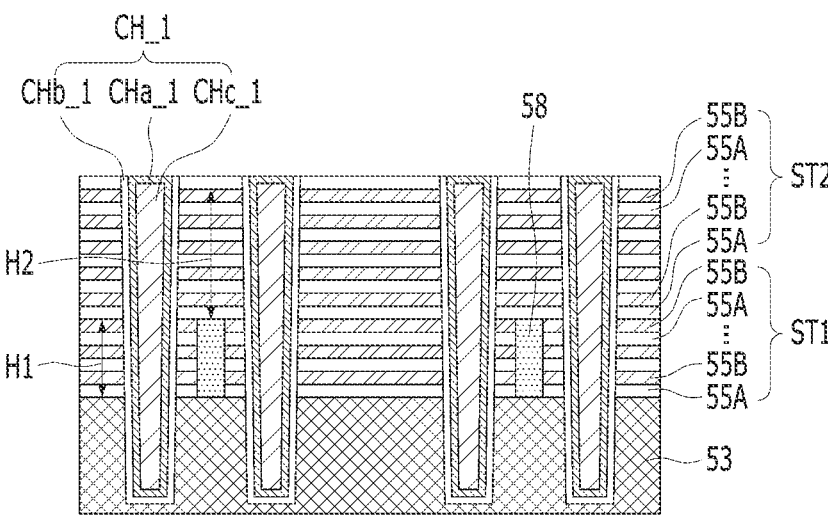
Figure 5B:
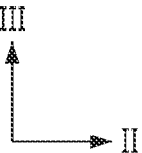
Figure 5C:
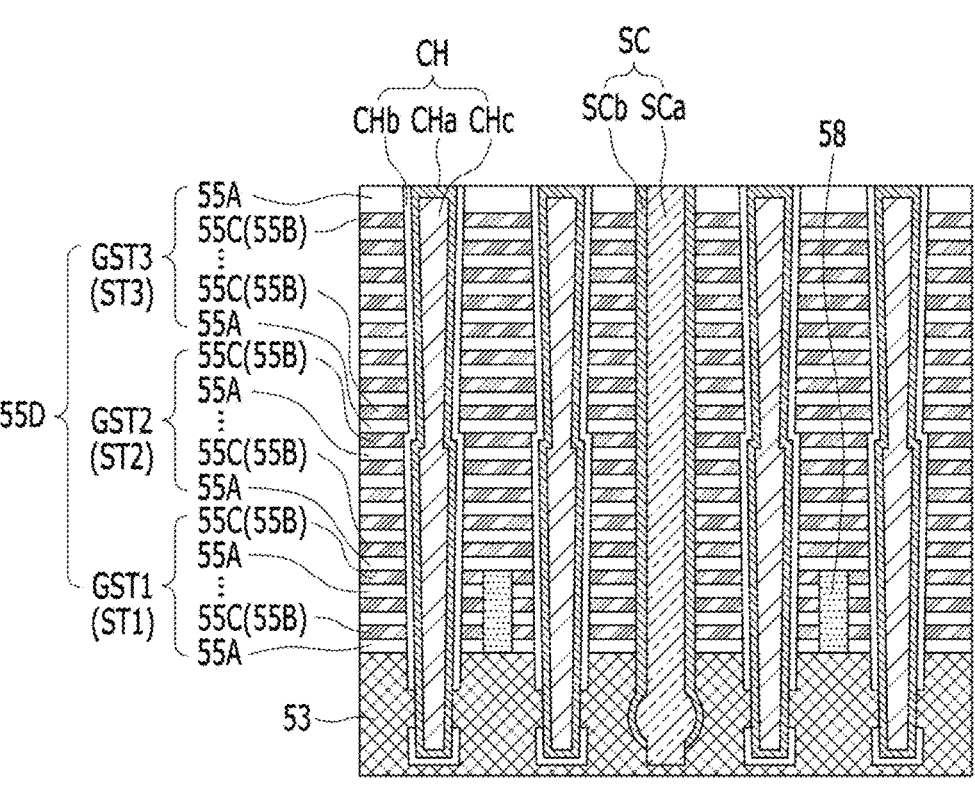

FIG. 5A to FIG. 5C are diagrams for describing a method of manufacturing a semiconductor device in accordance with an embodiment. Hereinafter, the content overlapping with the previously described content will be omitted.

Referring to FIG. 5A, a source structure 53 may be formed. Although not illustrated in FIG. 5A, a peripheral circuit and a peripheral circuit interconnection connected to the peripheral circuit may be formed before the source structure 53 is formed. For example, when forming the transistor 41, the third contact plugs 42A, or the wirings 42B in FIG. 4A, the peripheral circuit and the peripheral circuit interconnection may be formed. The source structure 53 may include a cell area and an edge area. The cell area of the source structure 53 may be the cell area 23_C of the source structure 23 in FIG. 2A, and may correspond to the cell area of the semiconductor chip 200.

Subsequently, a first stack ST1 may be formed on the source structure 53. For example, the first stack ST1 may be formed on the cell area of the source structure 53. The first stack ST1 may be formed by alternately stacking first material layers 55A and second material layers 55B. For reference, the first stack ST1 may also extend up to the edge area of the source structure 53. The first stack ST1 may extend to be connected to the first stack ST1 in FIG. 4B. For example, the first material layers 55A of the first stack ST1 may be connected to the first material layers 45A of the first stack ST1 in FIG. 4B, and the second material layers 55B of the first stack ST1 may be connected to the second material layers 45B of the first stack ST1 in FIG. 4B.

Subsequently, isolation insulating layers 58 passing through the first stack ST1 may be formed. For example, the isolation insulating layers 58 passing through the first stack ST1 and connected to the cell area of the source structure 53 may be formed. First, fourth openings OP4 passing through the first stack ST1 and exposing the cell area of the source structure 53 may be formed. Subsequently, the isolation insulating layers 58 may be formed in the fourth openings OP4, respectively.

When the isolation insulating layers 58 are formed, the first sacrificial layers 46A in FIG. 4B may be formed. For example, the fourth openings OP4 may be formed in the cell area of the source structure 53 by using substantially the same mask pattern as an etch barrier, and simultaneously the first openings OP1 may be formed in the edge area of the source structure 43. Furthermore, when the isolation insulating layers 58 are formed in the fourth openings OP4, respectively, the first sacrificial layers 46A may be formed in the first openings OP1, respectively. Accordingly, the isolation insulating layer 58 may be formed to have a structure similar to that of the first sacrificial layer 46A, and may be formed at substantially the same level as that of the first sacrificial layer 46A or may include substantially the same material as that of the first sacrificial layer 46A. The isolation insulating layers 58 may each include an insulating material such as oxide or nitride. The words "simultaneous" and "simultaneously" as used herein with respect to processes mean that the processes take place on overlapping intervals of time. For example, if a first process takes place over a first interval of time and a second process takes place simultaneously over a second interval of time, then the first and second intervals at least partially overlap each other such that there exists a time at which the first and second processes are both taking place.

Referring to FIG. 5B, a second stack ST2 may be formed on the first stack ST1. The second stack ST2 may be formed by alternately stacking the first material layers 55A and the second material layers 55B. The second stack ST2 may extend to be connected to the second stack ST2 in FIG. 4C. For example, the first material layers 55A of the second stack ST2 may be connected to the first material layers 45A of the second stack ST2 in FIG. 4C, and the second material layers 55B of the second stack ST2 may be connected to the second material layers 45B of the second stack ST2 in FIG. 4C. In this case, the first height H1 of the first stack ST1 may be lower than the second height H2 of the second stack ST2.

Subsequently, first channel structures CH_1 passing through a part of the second stack ST2, the first stack ST1, and the source structure 53 may be formed. For example, the first channel structures CH_1 passing through a part of the second stack ST2, the first stack ST1, and the cell area of the source structure 53 may be formed. Each of the first channel structures CH_1 may further include at least one of a memory layer CHb_1 surrounding a sidewall of a channel layer CHa_1 or an insulating core CHc_1 in the channel layer CHa_1.

Referring to FIG. 5C, a third stack ST3 may be formed on the second stack ST2. The third stack ST3 may be formed by alternately stacking the first material layers 55A and the second material layers (not illustrated). The third stack ST3 may extend to be connected to the third stack ST3 in FIG. 4C. For example, the first material layers 55A of the third stack ST3 may be connected to the first material layers 45A of the third stack ST3 in FIG. 4C, and the second material layers 55B of the third stack ST3 may be connected to the second material layers 45B of the third stack ST3 in FIG. 4C.

Subsequently, channel structures CH passing through the third stack ST3 may be formed. The channel structures CH may be formed by forming an opening, which exposes each of the first channel structures CH_1 by passing through the third stack ST3, and forming a second channel structure (not illustrated) in the opening. The channel structures CH may each include a channel layer CHa, a memory layer CHb, or an insulating core CHc, or a combination thereof.

Subsequently, a source contact structure SC passing through a part of the third stack ST3, the second stack ST2, the first stack ST1, and the source structure 53 may be formed. First, an opening passing through a part of the third stack ST3, the second stack ST2, the first stack ST1 and the source structure 53 may be formed, and a source contact spacer SCb and a source contact plug SCa may be sequentially formed in the opening.

Before the source contact structure SC is formed, the first stack ST1, the second stack ST2, and the third stack ST3 may be replaced with a first gate structure GST1, a second gate structure GST2, and a third gate structure GST3, respectively. For example, the second material layers 55B of the first stack ST1, the second stack ST2, and the third stack ST3 may be replaced with third material layers 55C. In this case, the third material layer 55C may be a conductive layer. Accordingly, a gate structure 55 including the first gate structure GST1, the second gate structure GST2, and the third gate structure GST3 may be formed. The conductive layer may include a conductive material such as polysilicon, tungsten, or molybdenum.

According to the process described above, when the isolation insulating layers 58 are formed in the cell area of the source structure 53, the first sacrificial layers 46A may be formed in the edge area of the source structure 43 in FIG. 4B. Accordingly, a read-only memory (ROM) may be formed in a read-only memory (ROM) area of the edge area by utilizing the process performed in the cell area.

Figure 6:
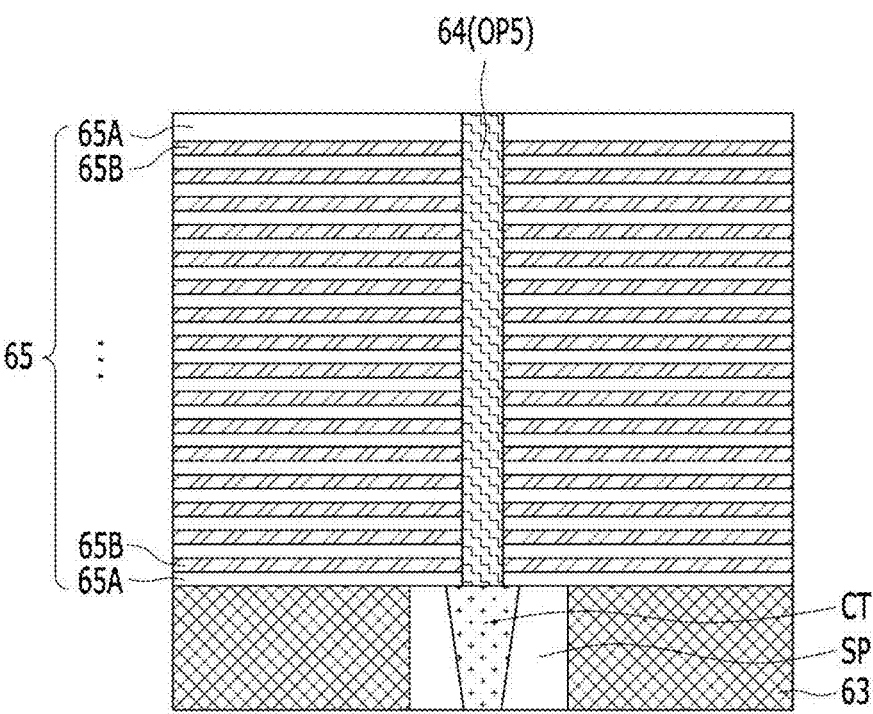
FIG. 6 is a diagram for describing a method of manufacturing a semiconductor device in accordance with an embodiment.

FIG. 6 is a diagram for describing a method of manufacturing a semiconductor device in accordance with an embodiment. Hereinafter, the content overlapping with the previously described content will be omitted.

Referring to FIG. 6, a source structure 63 may be formed. Although not illustrated in FIG. 6, a peripheral circuit may be formed before the source structure 63 is formed. The source structure 63 may include a cell area and an edge area. The cell area of the source structure 63 may be the cell area 23_C of the source structure 23 in FIG. 2A, and may correspond to the cell area of the semiconductor chip 200.

Subsequently, a contact structure CT passing through the source structure 63 may be formed. First, an opening passing through the cell area of the source structure 63 may be formed, and an insulating layer may be formed in the opening. Subsequently, the contact structure CT may be formed in the insulating layer. In this case, an insulating layer remaining while forming the contact structure CT may be defined as a spacer SP. When the contact structure CT is formed, the first contact plugs 44 in FIG. 4A may be formed. For example, the first contact plugs 44 may be formed in the edge area of the source structure 43 by using, as an etch barrier, a mask pattern used when forming the contact structure CT in the cell area of the source structure 63. Accordingly, the contact structure CT may be formed to have a structure similar to that of the first contact plug 44, and may be formed at substantially the same level as that of the first contact plug 44 or may include substantially the same material as that of the first contact plug 44. The contact structure CT may include a conductive material such as tungsten.

Subsequently, a dummy stack 65 may be formed on the source structure 63. For example, the dummy stack 65 may be formed on the cell area of the source structure 63. The dummy stack 65 may be formed by alternately stacking first material layers 65A and second material layers 65B. For reference, the dummy stack 65 may also extend up to the edge area of the source structure 63. The dummy stack 65 may extend to be connected to the stack 45 in FIG. 4C. For example, the first material layers 65A of the dummy stack 65 may be connected to the first material layers 45A of the stack 45 in FIG. 4C, and the second material layers 65B of the dummy stack 65 may be connected to the second material layers 45B of the stack 45 in FIG. 4C.

Subsequently, a first cell contact plug 64 passing through the dummy stack 65 may be formed. For example, the first cell contact plug 64 passing through the dummy stack 65 and connected to the cell area of the source structure 63 may be formed. First, a fifth opening OP5, which exposes the cell area of the source structure 63 by passing through the dummy stack 65, may be formed. Subsequently, the first cell contact plug 64 may be formed in the fifth opening OP5.

When the first cell contact plug 64 is formed, the second sacrificial layers 46B in FIG. 4D may be formed. For example, the fifth opening OP5 may be formed in the cell area of the source structure 63 by using substantially the same mask pattern as an etch barrier, and simultaneously the second openings OP2 may be formed in the edge area of the source structure 43. Furthermore, when the first cell contact plug 64 is formed in the fifth opening OP5, the second sacrificial layers 46B may be formed in the second openings OP2, respectively. Accordingly, the first cell contact plug 64 may be formed to have a structure similar to that of the second sacrificial layer 46B, and may be formed at substantially the same level as that of the second sacrificial layer 46B or may include a material substantially the same as or different from that of the second sacrificial layer 46B. The first cell contact plug 64 may include a conductive material such as tungsten, or an insulating material such as oxide or nitride.

For example, the first cell contact plug 64 may include an insulating material such as oxide or nitride. In such a case, the dummy stack 65 may be used as a support for minimizing the inclination of the dummy stack 65 in the process of replacing the dummy stack 65 with a gate structure. As another example, when a sacrificial layer is formed in the fifth opening OP5, the second sacrificial layers 46B may be formed in the second openings OP2, respectively. Subsequently, the sacrificial layer in the fifth opening OP5 may be replaced with a conductive material such as tungsten. Accordingly, the first cell contact plug 64 electrically connected to the contact structure CT may be formed, and may be electrically connected to a peripheral circuit.

According to the process described above, when the first cell contact plug 64 is formed in the cell area of the source structure 63, the second sacrificial layers 46B may be formed in the edge area of the source structure 43 in FIG. 4D. Accordingly, a read-only memory (ROM) may be formed in a read-only memory (ROM) area of the edge area by utilizing the process performed in the cell area.

Figure 7:
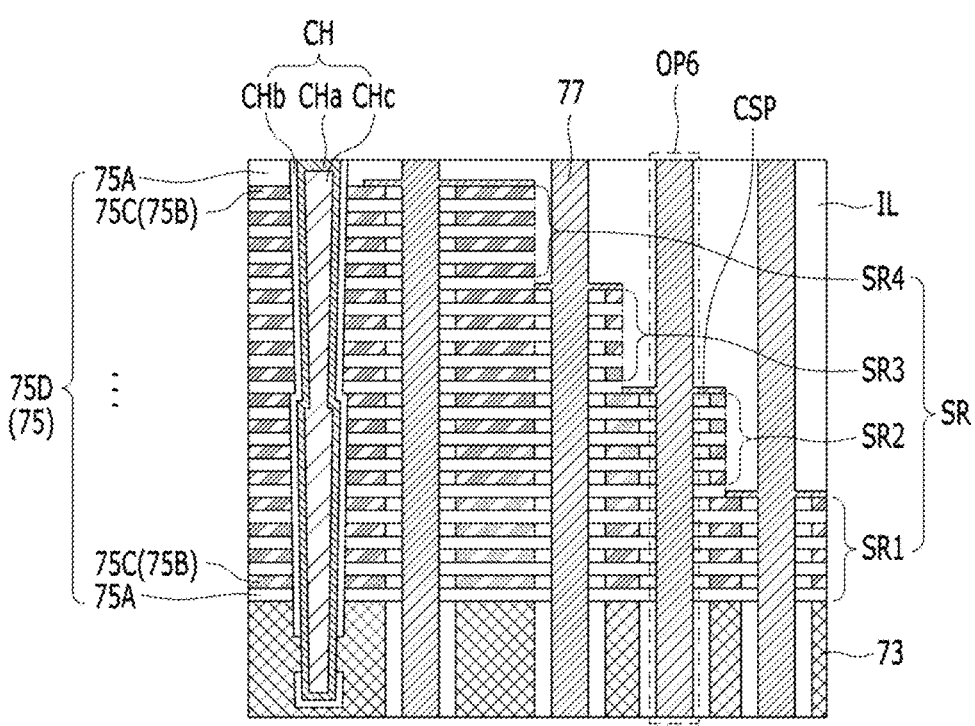
FIG. 7 is a diagram for describing a method of manufacturing a semiconductor device in accordance with an embodiment.

FIG. 7 is a diagram for describing a method of manufacturing a semiconductor device according to an embodiment. Hereinafter, the content overlapping with the previously described content will be omitted.

Referring to FIG. 7, a source structure 73 may be formed. Although not illustrated in FIG. 7, a peripheral circuit may be formed before forming the source structure 73. The source structure 73 may include a cell area and an edge area. The cell area of the source structure 73 may be the cell area 23_C of the source structure 23 in FIG. 2A, and may correspond to the cell area of the semiconductor chip 200.

Subsequently, a stack 75 may be formed on the source structure 73. For example, the stack 75 may be formed on the cell area of the source structure 73. The stack 75 may be formed by alternately stacking first material layers 75A and second material layers 75B. For reference, the stack 75 may also extend up to the edge area of the source structure 73. The stack 75 may extend to be connected to the stack 45 in FIG. 4C.

Subsequently, a channel structure CH passing through the stack 75 and a part of the source structure 73 may be formed. For example, the channel structure CH passing through the stack 75 and a part of the cell area of the source structure 73 may be formed. The channel structure CH may further include at least one of a memory layer CHb surrounding a sidewall of the channel layer CHa or an insulating core CHc within the channel layer CHa.

Subsequently, the stepped structure SR may be formed in the stack 75. The stepped structure SR may include the first material layers 75A and the second material layers 75B alternately stacked. The stepped structure SR may include a first stepped structure SR1, a second stepped structure SR2, a third stepped structure SR3, and a fourth stepped structure SR4. A buffer layer may be formed on the uppermost second material layer 75B exposed to each of the stepped structures SR1 to SR4. The buffer layer is a sacrificial layer and used to form a protrusion of a second cell contact plug 77 to be described below. The buffer layer may be a single layer or a multilayer layer. Subsequently, an interlayer dielectric layer IL may be formed on the stack 75. Subsequently, the second material layers 75B may be replaced with third material layers 75C. The third material layer 75C may be a conductive layer, and may include a conductive material such as polysilicon, tungsten, or molybdenum. Accordingly, a gate structure 75D including the first material layers 75A and the third material layers 75C alternately stacked may be formed.

Subsequently, the second cell contact plugs 77 connected to the stepped structure SR may be formed. First, the sixth openings OP6 passing through the interlayer dielectric layer IL, the stepped structures SR1 to SR4, and the source structure 73 may be formed. Subsequently, after openings are formed by selectively etching the second material layers 75B, cell spacers CSP may be formed in the openings, respectively. Subsequently, after the buffer layers are removed, the second cell contact plugs 77 may be formed in the sixth openings OP6, respectively. The protrusions may be formed in the area from which the buffer layers are removed, and each of the second cell contact plugs 77 may be electrically connected to the uppermost conductive layer of each of the stepped structures SR1 to SR4 by the protrusion.

When the second cell contact plugs 77 are formed, the second contact plugs 47 in FIG. 4F may be formed. For example, the sixth openings OP6 may be formed in the cell area of the source structure 73 by using substantially the same mask pattern as an etch barrier, and simultaneously the third openings OP3 may be formed in the edge area of the source structure 43. Furthermore, when the second cell contact plugs 77 are formed in the sixth openings OP6, respectively, the second contact plugs 47 may be formed in the third openings OP3, respectively.

Accordingly, the second cell contact plug 77 may be formed to have a structure similar to that of the second contact plug 47, and may be formed at substantially the same level as of the second contact plug 47 or may include substantially the same material as of the second contact plug 47. The second cell contact plug 77 may include a conductive material such as tungsten.

For reference, although not illustrated in FIG. 7, the second cell contact plugs 77 may be connected to a peripheral circuit formed below the source structure 73 by passing through the source structure 73.

According to the process described above, when the second cell contact plugs 77 are formed in the cell area of the source structure 73, the second contact plugs 47 may be formed in the edge area of the source structure 43 in FIG. 4F. Accordingly, in an embodiment, a read-only memory (ROM) may be formed in a read-only memory (ROM) area of the edge area by utilizing the process performed in the cell area.

Although embodiments according to the technical idea of the present disclosure have been described above with reference to the accompanying drawings, this is only for explaining the embodiments according to the concept of the present disclosure, and the present disclosure is not limited to the above embodiments. Various types of substitutions, modifications, and changes for the embodiments may be made by those skilled in the art, to which the present disclosure pertains, without departing from the technical idea of the present disclosure defined in the following claims, and it should be construed that these substitutions, modifications, and changes belong to the scope of the present disclosure.

What is claimed is:

1. A semiconductor device comprising:
a source structure comprising a cell area and an edge area, wherein the source structure includes a conductive material;
a stack located on the edge area of the source structure and vertically overlapping the conductive material of the source structure;
a gate structure located on the cell area of the source structure;
a channel structure connected to the cell area of the source structure by extending through the gate structure; and
a read-only memory comprising a first contact plug passing through the edge area of the source structure and a second contact plug connected to the first contact plug by extending through the stack.

2. The semiconductor device of claim 1, wherein the read-only memory comprises a transistor electrically connected to the first contact plug.

3. The semiconductor device of claim 2, wherein the transistor is configured to store data.

4. The semiconductor device of claim 1, wherein the read-only memory is located in an edge area of a semiconductor chip.

5. The semiconductor device of claim 1, wherein the stack comprises a first stack adjacent to the edge area of the source structure and a second stack spaced apart from the edge area of the source structure.

6. The semiconductor device of claim 5, wherein a first height of the first stack is lower than a second height of the second stack.

7. The semiconductor device of claim 1, wherein the gate structure comprises a first gate structure adjacent to the cell area of the source structure and a second gate structure spaced apart from the cell area of the source structure.

8. The semiconductor device of claim 7, further comprising:

an isolation insulating layer passing through the first gate structure and connected to the cell area of the source structure.

9. The semiconductor device of claim 1, wherein the source structure includes polysilicon.

10. The semiconductor device of claim 1, further comprising:

an insulating spacer interposed between the first contact plug and the source structure.

11. A semiconductor device comprising:

a substrate comprising a cell area and a read-only memory area;

a stack located over the read-only memory area of the substrate;

a gate structure located over the cell area of the substrate;

a conductive source structure located between the gate structure and the substrate, and extending between the stack and the read-only memory area of the substrate to vertically overlap the stack;

a channel structure connected to the conductive source structure by extending through the gate structure;

a read-only memory comprising a first contact plug passing through the conductive source structure and a second contact plug connected to the first contact plug by extending through the stack; and an insulating spacer interposed between the first contact plug and the conductive source structure.

12. The semiconductor device of claim 11, wherein the read-only memory comprises a transistor electrically connected to the first contact plug.

13. The semiconductor device of claim 12, wherein the transistor is configured to store data.

14. The semiconductor device of claim 11, wherein the read-only memory is located in an edge area of a semiconductor chip.

15. The semiconductor device of claim 11, wherein the stack comprises a first stack adjacent to the read-only memory area of the substrate and a second stack spaced apart from the read-only memory area of the substrate.

16. The semiconductor device of claim 15, wherein a first height of the first stack is lower than a second height of the second stack.

17. The semiconductor device of claim 11, wherein the gate structure comprises a first gate structure adjacent to the cell area of the substrate and a second gate structure spaced apart from the cell area of the substrate.

18. The semiconductor device of claim 17, further comprising:

an isolation insulating layer passing through the first gate structure and connected to the cell area of the source structure.

19. The semiconductor device of claim 11, wherein the source structure includes polysilicon.

* * * * *